United States Patent
Scott et al.

(10) Patent No.: US 8,217,685 B2
(45) Date of Patent: Jul. 10, 2012

(54) INPUT/OUTPUT DRIVER WITH CONTROLLED TRANSISTOR VOLTAGES

(75) Inventors: Gregory S. Scott, Santa Clara, CA (US); Vincent R. von Kaenel, Palo Alto, CA (US)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 13/215,433

(22) Filed: Aug. 23, 2011

(65) Prior Publication Data

US 2011/0304363 A1 Dec. 15, 2011

Related U.S. Application Data

(63) Continuation of application No. 12/404,577, filed on Mar. 16, 2009, now Pat. No. 8,026,745.

(51) Int. Cl.
*H03K 3/00* (2006.01)

(52) U.S. Cl. ........................................................ 327/108

(58) Field of Classification Search ........................... None
See application file for complete search history.

(56) References Cited

U.S. PATENT DOCUMENTS

| | | | |
|---|---|---|---|
| 5,646,809 A | 7/1997 | Motley et al. | |
| 6,163,176 A | 12/2000 | Baschirotto | |
| 6,169,420 B1 | 1/2001 | Coddington et al. | |
| 6,181,314 B1 | 1/2001 | Nakajima | |
| 6,515,520 B2 | 2/2003 | Kiyose | |
| 6,573,752 B1 | 6/2003 | Killat | |
| 7,239,197 B2 | 7/2007 | Chen et al. | |
| 7,279,924 B1 | 10/2007 | Shumarayev | |
| 7,285,987 B2* | 10/2007 | Chung | 327/65 |
| 7,429,873 B2 | 9/2008 | Peschke | |
| 7,466,188 B2 | 12/2008 | Fifield | |
| 2004/0160261 A1 | 8/2004 | Koch | |
| 2005/0052201 A1* | 3/2005 | Bernard et al. | 326/82 |
| 2005/0225363 A1 | 10/2005 | Lee | |
| 2008/0018365 A1 | 1/2008 | Okubo | |
| 2008/0204109 A1* | 8/2008 | Pilling et al. | 327/333 |
| 2009/0121751 A1* | 5/2009 | Bach | 327/108 |

* cited by examiner

*Primary Examiner* — Lincoln Donovan
*Assistant Examiner* — Khareem E Almo
(74) *Attorney, Agent, or Firm* — Lawrence J. Merkel; Meyertons, Hood, Kivlin, Kowert & Goetzel, P.C.

(57) ABSTRACT

In an embodiment, an integrated circuit comprises core circuitry and at least one driver circuit. The core circuitry is powered by a first supply voltage during use, and comprises a control circuit configured to generate a pull up control signal, a pull down control signal, and at least one reference voltage. The driver circuit is powered by a second supply voltage during use, the second supply voltage having a greater magnitude than the first supply voltage. The driver circuit is connected to a pad to be connected to a pin on a package of the integrated circuit. The driver circuit comprises a cascode connection of a first transistor and a second transistor, and a capacitor coupled between a first gate terminal of the first transistor and a second gate terminal of the second transistor. The first gate terminal is coupled to receive the pull down control signal.

32 Claims, 2 Drawing Sheets

INPUT/OUTPUT DRIVER WITH CONTROLLED TRANSISTOR VOLTAGES

This application is a continuation of U.S. patent application Ser. No. 12/404,577, filed on Mar. 16, 2009 and now U.S. Pat. No. 8,026,745, which is incorporated herein by reference in its entirety.

BACKGROUND

1. Field of the Invention

This invention is related to the field of integrated circuits and, more/particularly, to input/output driver circuits.

2. Description of the Related Art

Integrated circuits generally include core circuitry that implements the operation for which the integrated circuit is designed, driver circuitry to drive output signals from the integrated circuit to external circuitry, and receiver circuits to receive input signals from external circuitry. The driver/receiver circuitry buffers and isolates the core circuitry from the external circuitry, handling the larger loads, higher current flows, higher voltages, noise, etc. involved in external communication.

Originally, the core circuitry operated with the same power supply voltage as the driver/receiver circuitry. However, as semiconductor fabrication technology continued to evolve and transistor feature sizes continued to be reduced, the core circuitry eventually required power supply voltages lower than those that could be used for communicating with the external circuitry. In some cases, backward compatibility with legacy external circuitry that was not manufactured using the most advanced semiconductor fabrication technology was desired. In other cases, a higher communication voltage is required by the effects of noise and other factors that affect the reliability of external communications.

The driver/receiver circuitry designs have changed to handle the differences in internal supply voltages and external communication voltages. For example, transistors used in the driver/receiver circuitry can implement feature sizes that are larger than the transistors used in the core circuitry, to safely handle the higher voltages. Level shifting techniques can be used to translate signals from the core circuitry domain to the driver/receiver domain, and vice versa.

For long term reliability reasons, the voltage drop across any two terminals of the transistors needs to be limited to a specified maximum. If the voltage drop consistently exceeds the maximum, the transistors will cease to function (or "burn out"). The oxide between the gate and the semiconductor substrate can be destroyed, for example. The channel can be destroyed as well, if the drain to source voltage exceeds the maximum.

SUMMARY

In one embodiment, a driver circuit comprises a first transistor and a second transistor coupled in series between a supply conductor and an output conductor of the driver circuit. The driver circuit further comprises a capacitor coupled between a first gate terminal of the first transistor and a second gate terminal of the second transistor. The driver circuit further comprises a first conductor coupled to the first gate terminal, wherein a control signal on the first conductor is asserted during use to activate the first transistor.

In an embodiment, an integrated circuit comprises core circuitry and at least one driver circuit. The core circuitry is powered by a first supply voltage during use, and the core circuitry comprises a control circuit configured to generate a pull up control signal, a pull down control signal, and at least one reference voltage. The driver circuit is powered by a second supply voltage during use, the second supply voltage having a greater magnitude than the first supply voltage. The driver circuit is connected to a pad of the integrated circuit to be connected to a pin on a package of the integrated circuit. The driver circuit comprises a cascode connection of a first transistor and a second transistor, and a capacitor coupled between a first gate terminal of the first transistor and a second gate terminal of the second transistor. The first gate terminal is coupled to receive the pull down control signal.

In an embodiment, a driver circuit comprises a first cascode connection of a first transistor and a second transistor between a power supply conductor and an output pad; a first capacitor coupled between a first gate terminal of the first transistor and a second gate terminal of the second transistor; a second cascode connection of a third transistor and a fourth transistor between a ground conductor and the output pad; and a second capacitor coupled between a third gate terminal of the third transistor and a fourth gate terminal of the fourth transistor.

BRIEF DESCRIPTION OF THE DRAWINGS

The following detailed description makes reference to the accompanying drawings, which are now briefly described.

Figure 1:
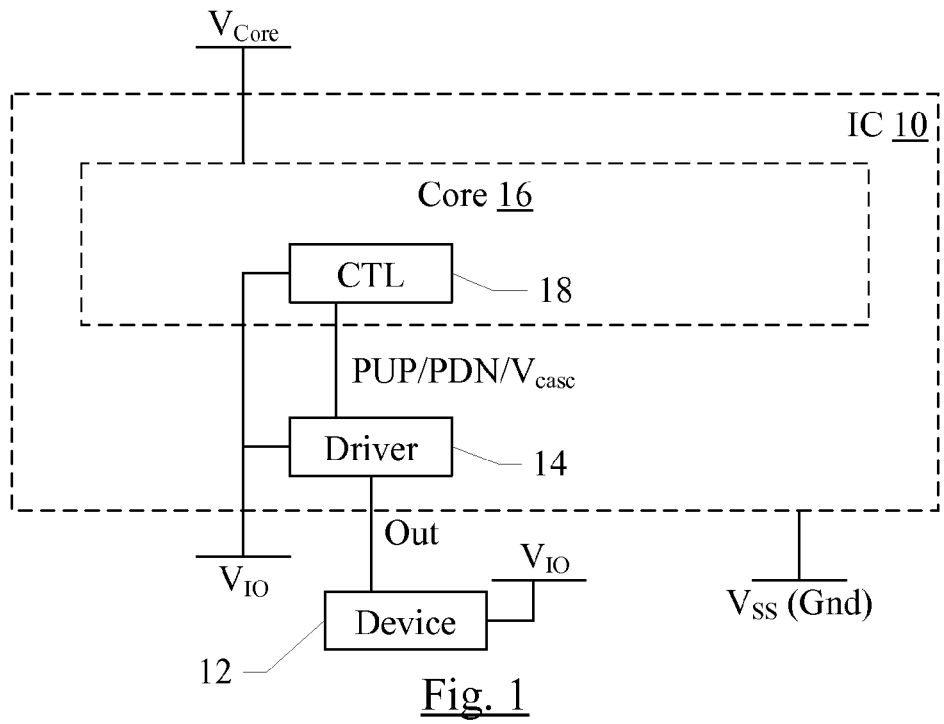
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit (IC) 10 and an external device 12 is shown. The integrated circuit 10 includes an output pin to which the device 12 is coupled (e.g. via a conductor on a board to which the integrated circuit 10 and the device 12 are mounted, via a connector cable, etc.). A driver circuit 14 in the integrated circuit 10 is connected to an output pad of the integrated circuit 10, to which the pin may be connected when the integrated circuit 10 is packaged. The integrated circuit further includes core circuitry 16, which includes control circuit 18 that is coupled to the driver circuit 14. Specifically, the control circuit 18 may provide an pull up (PUP) control signal, a pull down (PDN) control signal, and one or more reference voltages ($V_{casc}$) to the driver circuit 14. The driver circuit 18 is supplied by a supply voltage $V_{IO}$ that is used to communicate with the external device 12 on the output pin, and the core circuitry 16 is supplied by a $V_{Core}$ supply voltage. The external device 12 is also supplied by the $V_{IO}$ supply voltage. The integrated circuit is further supplied with a $V_{SS}$ supply voltage (e.g. ground) to which the $V_{IO}$ and $V_{Core}$ voltages are referenced. The $V_{IO}$ supply voltage may be higher than the $V_{Core}$ supply voltage during use. For example, the $V_{IO}$ supply voltage may be 3.3 volts, and the $V_{Core}$ supply voltage may be 1.8 volts, or even less such as about 1.0 volts.

The driver circuit 14 may receive the PUP and PDN signals, and may drive the output high (PUP asserted) or low (PDN asserted). The driver circuit 14 may not actively drive the output if neither PUP nor PDN is asserted (also referred to as "tristating" the output). Generally, a control signal may be considered to be asserted in either the high state or the low state, and deasserted in the other state. In one embodiment, the PUP signal is asserted low, and the PDN signal is asserted high.

The core circuit 16 operates according to the $V_{Core}$ supply voltage, and thus signals generated by the core circuit 16 generally swing between $V_{SS}$ and $V_{Core}$. Specifically, the driver circuit 14 may drive the output to the $V_{IO}$ voltage in response to an assertion of the PUP signal and may drive the output to the $V_{SS}$ voltage in response to an assertion of the PDN signal. However, the control circuit 18 may include one or more level shifters to shift signals that are supplied to the driver circuit 14. Specifically, for example, the PUP signal may be shifted so that it swings between $V_{IO}$ and a voltage that is higher than $V_{SS}$ (e.g., a voltage that is about the $V_{casc}$ voltage). The level shifting of the PUP control signal may be necessary to control transistors in the driver circuit 14 without a voltage drop across any of the transistor's terminals that would exceed specification. For such embodiments, the control circuit 18 may also be coupled to receive the $V_{IO}$ voltage, as illustrated in FIG. 1. In other embodiments, the level shifter circuitry may be included in the driver circuit 14 and the control circuit 18 may not be coupled to receive the $V_{IO}$ voltage.

The control circuit 18 may be configured to control the driver circuit 14 in any desired fashion. For example, the control circuit 18 may be programmable (e.g. in a register) to pull up the output, pull down the output, or tristate the output. Software may write the register to drive the desired values. Alternatively, the control circuit 18 may control the output automatically according to an interface specification for the external device 12. The control circuit 18 may generate the reference voltage $V_{casc}$ in any desired fashion. For example, the reference voltage may be the $V_{Core}$ voltage, or may be generated from the $V_{Core}$ voltage (e.g. using a band gap generator, for example). In one embodiment, the output may be a general purpose IO (GPIO) pin that may be connected to any external device and controlled by software.

The core circuitry 16 may generally comprise the circuitry that implements the operation for which the integrated circuit 10 is designed. For example, if the design includes one or more processors, the core circuitry 16 may include the circuitry that implements the processor operation (e.g. instruction fetch, decode, execution, and result write). The processors may include general purpose processors and/or graphics processors in various embodiments. If the design includes a bridge to a peripheral interface, the core circuitry 16 may include the circuitry that implements the bridge operation. If the design includes other communication features such as packet interfaces, network interfaces, etc., core circuitry 16 may include circuitry implementing the corresponding features. The integrated circuit 10 may generally be designed to provide any set of operations. Generally, the core circuitry 16 may comprise any combination of one or more of the following: memory arrays, combinatorial logic, state machines, flops, registers, other clocked storage devices, custom logic circuits, etc.

While one output pin is illustrated explicitly in FIG. 1, there may be multiple output pins of the integrated circuit 10 that are coupled to the device 12, and/or there may be additional pins to which other devices are coupled. The output pin may be an input/output pin (e.g. if a receiver circuit is also coupled to the output pin), and there may also be input pins having additional receiver circuits coupled to the input pins. Other driver circuits similar to the driver circuit 14 may be used for pins on which the voltages used to communicate are $V_{IO}$ voltages. Other pins may use $V_{Core}$ voltages for communication, and thus may use different types of driver circuits, as desired.

It is noted that driver circuitry may be used within an integrated circuit as well, if the integrated circuit supports multiple voltage domains within the core circuitry 16. Driver circuits similar to driver circuit 14 may be used in such embodiments as well, and the external device may be integrated into the integrated circuit 10 in such embodiments (but may be external to the core circuitry 16 and is $V_{Core}$ voltage domain).

The apparatus shown in FIG. 1 may be included in any type of electronic system. For example, the apparatus may be implemented in a mobile computing device, which may include various communications devices (e.g. for cell phone communication, wireless (wifi) communication, global position system (GPS) communication, etc.), devices for audio and video playback, etc.

It is noted that, while the present embodiment illustrates the device 12 having the same supply voltage as the driver circuit 14 ($V_{IO}$), other embodiments may have different supply voltages for the device 12 and the driver circuit 14. Additionally, in some embodiments, the $V_{SS}$ for the core 16 may be different from the $V_{SS}$ for the driver circuit 14.

Figure 2:
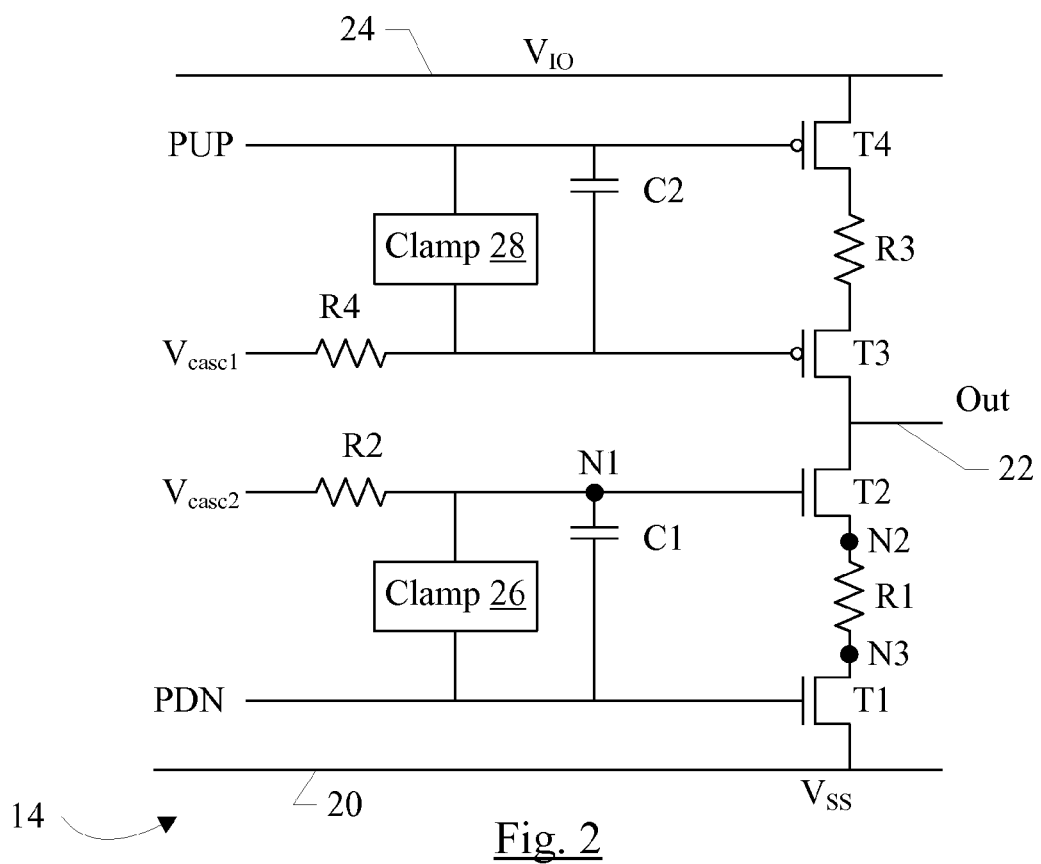
FIG. 2 is a circuit diagram of one embodiment of a driver circuit shown in FIG. 1.

Turning now to FIG. 2, a circuit diagram illustrating one embodiment of the driver circuit 14 is shown. In the embodiment of FIG. 2, the driver circuit 14 includes cascode-connected n-type metal-oxide-semiconductor (NMOS) transistors T1 and T2 and cascode-connected p-type MOS (PMOS) transistors T3 and T4. That is, transistors T1 and T2 are coupled in series between a power supply conductor 20 and an output pad 22. Similarly, transistors T3 and T4 are coupled in series between a power supply conductor 24 and the output pad 22. In the illustrated embodiment, a resistor R1 is connected in series between the transistor T1 and the transistor T2, and the resistor R3 is connected in series between the transistor T3 and the transistor T4. Other embodiments may not include the resistors R1 and R3, and thus the transistors T1 and T2 may be directly connected and the transistors T3 and T4 may be directly connected. The gate terminal of the transistor T1 is coupled to a conductor to receive the PDN signal from the control circuit 18. Additionally, the capacitor C1 is coupled between the gate terminals of the transistors T1 and T2. Coupled in parallel with the capacitor C1 is an optional clamp circuit 26. A resistor R2 is connected to the gate terminal of the transistor T2. The other terminal of the resistor R2 (the terminal that is not connected to the gate terminal) is connected to receive the $V_{casc2}$ voltage from the control circuit 18. The gate terminal of the transistor T4 is coupled to a conductor to receive the PUP signal from the control circuit 18. Additionally, the capacitor C2 is coupled between the gate terminals of the transistors T3 and T4. Coupled in parallel with the capacitor C2 is an optional clamp circuit 28. A resistor R4 is connected to the gate terminal of the transistor T3. The other terminal of the resistor R4 (the terminal that is not connected to the gate terminal) is connected to receive the $V_{casc1}$ voltage from the control circuit 18. The $V_{casc1}$ and $V_{casc2}$ voltages may be approximately midrange between the $V_{IO}$ and $V_{SS}$ voltages. For example, the voltages may be about 1.6 and 1.8 volts, respectively, if $V_{IO}$ is 3.3 volts with respect to $V_{SS}$. In other embodiments, $V_{casc1}$ and $V_{casc2}$ may be equal (e.g. they may be connected together to a single $V_{casc}$ voltage).

The transistors T1 to T4 are designed for medium to small voltage levels (e.g. about 1.8 volts or less in this example). In some embodiments, the transistors T1 to T4 may be the same as signalling transistors in the core circuitry 16. In other embodiments, the signalling transistors may be designed for lower voltages than the transistors T1 to T4. The transistors T1 to T4 are not designed for voltages of the $V_{IO}$ magnitude. To prevent degradation of the transistors, the voltage drop across any two terminals during operation should be limited to no more than about 10% above the rated voltage.

The pull down circuit structure (transistors T1 and T2, capacitor C1, and optionally resistor R1 and clamp circuit 26) will be discussed first. The operation of the pull up circuit structure (transistors T3 and T4, capacitor C2, and optionally resistor R3 and clamp circuit 28) is similar and will be summarized afterwards.

The PDN signal swings between $V_{SS}$ and $V_{casc2}$ (or a voltage that is near $V_{casc2}$, but not necessarily exactly $V_{casc2}$, in one embodiment). Specifically, the PDN signal is $V_{SS}$ when the PDN signal is deasserted, and approximately $V_{casc2}$ when the PDN signal is asserted. When the PDN signal is deasserted, the pull down circuit is idle. At most, the voltage on the output pad 22 is $V_{IO}$ in while the pull down circuit is idle. The $V_{casc2}$ voltage on the gate terminal of the transistor T2 activates the transistor T2 if the voltage on the source of T2 is below $V_{casc2}$ minus the threshold voltage of the transistor T2 ($V_{th2}$). Thus, the node between the transistors T1 and T2 remains at approximately $V_{casc2}-V_{th2}$ when the PDN signal is deasserted (current flow through the resistor R1 is essentially zero when the pull down circuit is inactive). Accordingly, the voltage across the drain to source of transistor T2 is approximately $V_{IO}-V_{casc2}-V_{th2}$, which is within the specified limit. The voltage across the drain to source of the transistor T1 is approximately $V_{casc2}-V_{th2}$, again within specified limits. The gate to source and gate to drain voltages are also within specified limits.

When the PDN signal is asserted, the transistor T1 activates. Ignoring the resistor R1 temporarily, the node between the transistor T1 and the transistor T2 rapidly discharges. The output pad 22 also begins to discharge, but may often be connected to a significant capacitive load (as compared to the node between the transistors T1 and T2) and thus may discharge more slowly. This operation may cause the drain to source voltage across the transistor T2 to exceed the specified limit. However, the capacitor C1 capacitively couples the PDN signal to the gate terminal of the transistor T2. When the PDN signal rises, the voltage on the gate terminal of the transistor T2 also rises. The transistor T2 may be turned on more forcefully, more rapidly transferring charge to the node between the transistor T1 and T2. The capacitor C1 may be sized to ensure that the gate voltage of the transistor T2 rises enough to keep the drain to source voltage of the transistor T2 within specified limits. The excess voltage on the gate terminal of the transistor T2 dissipates through the resistor R2, returning the gate terminal of the transistor T2 to the $V_{casc2}$ voltage after the switching event. The time constant R2*C1 may be selected to dissipate the excess voltage provided through the capacitor C1 over a time that is approximately the same as the switching time on the output pad 22, for example. Alternatively, the time constant may be selected to be somewhat shorter than the discharge time: Since the output pad voltage is falling, the extra current capability of the transistor T2 from the rise in the gate terminal voltage is most useful at the beginning of the transition. In still another alternative, the time constant may be selected to be somewhat longer than the transition time, but short enough to ensure that the gate to drain voltage across the transistor T2 remains within specified limits.

The resistor R1 is provided, in some embodiments, to increase the margin of the circuit. As the transistor T2 drives current into the cascode connection, the resistor R1 develops a voltage drop that increases the voltage on the source of the transistor T2 and further aids in ensuring that the voltages across the terminals of the transistor T2 remain within specified limits. The resistor R1 has a relatively small resistance. For example, in one embodiment, the resistance may be less than or equal to about 20% of the series resistance of one of the transistors T2 and T1 when the transistor is on (actively conducting current in saturation). In another embodiment the resistance may be less than or equal to about 10% of the series resistance one of the transistors T2 or T1 when the transistor is on. The series resistance is the resistance between the drain and source of the transistor. The resistance of R1 is given as about 10% or 20% because various manufacturing variations may cause the exact percentage to vary. Viewed in another way, the resistance of R1 may be nominally 10% or 20% of the series resistance. The resistors R1 to R4 may be formed in any fashion. For example, in one embodiment, the resistors may be formed from p-type polysilicon over an n-type substrate that is passivated via connection to the $V_{IO}$ supply conductor 24.

During times that the pull down circuit is tristated, the capacitor C1 is susceptible to being charged through the Miller capacitance of the transistor T2 (from the pad 22). In some cases, the voltage may larger than the capacitor C1 can tolerate without failure. For example, the capacitor C1 may be formed from a transistor similar to T1 with both drain and source connected to one node (e.g. the gate terminal of T1) and the gate terminal connected to the other node (e.g. the gate terminal of T2). Such a capacitor may have similar voltage limits to the transistors T1 and T2. To prevent excessive voltage accumulation, the clamp circuit 26 may clamp the voltage on the capacitor to a maximum voltage. For example, the clamp circuit 26 may be formed from multiple diode-connected transistors in series. Each diode connected transistor adds a threshold voltage to the maximum clamp voltage. Three or four such transistors may be used in series, for example. The capacitor C1 (and C2) may be formed in any other fashion, in various embodiments.

The pull up circuit may operate in a similar fashion. As the PUP signal asserts low, the capacitor C2 couples the downward voltage change onto the gate terminal of the transistor T3, activating T3 more strongly and driving the voltage between the transistors T3 and T4 higher. The resistor R3 provides margin, and the resistor R4 drains the extra voltage introduced by C2. The clamp 28 ensures that the voltage across the capacitor does not exceed its capabilities. It is noted that, in some embodiments, the capacitor C2 and the clamp 28 may not be included. In some cases, the PMOS cascode transistor may be more resistant to higher voltage (e.g. higher drain to source voltage) because it has a better hot carrier lifetime than the NMOS transistors, and thus may not need the protection provided by the capacitor C2. If the capacitor C2 is not included, the clamp 28 is not needed, either.

The supply conductors 20 and 24 are powered to the respective voltages $V_{SS}$ and $V_{IO}$, as illustrated in FIG. 2, during use. The supply conductors are intended to carry a relatively stable voltage (as opposed to signal conductors, which carry signals that vary to covey information). While the voltage on the conductors may be subject to variance during use (e.g. voltage droop during high current conditions, noise, etc.), the conductors are nominally held at the desired voltage. For example, the conductors may be electrically connected to the $V_{IO}$ and $V_{SS}$ input pins of the integrated circuit, respectively. The output pad 22 is also a conductor, and may be electrically connected to a pin when the integrated circuit 10 is packaged. The form of the electrical connection varies based on the package, manufacturing process, etc.

Figure 3:
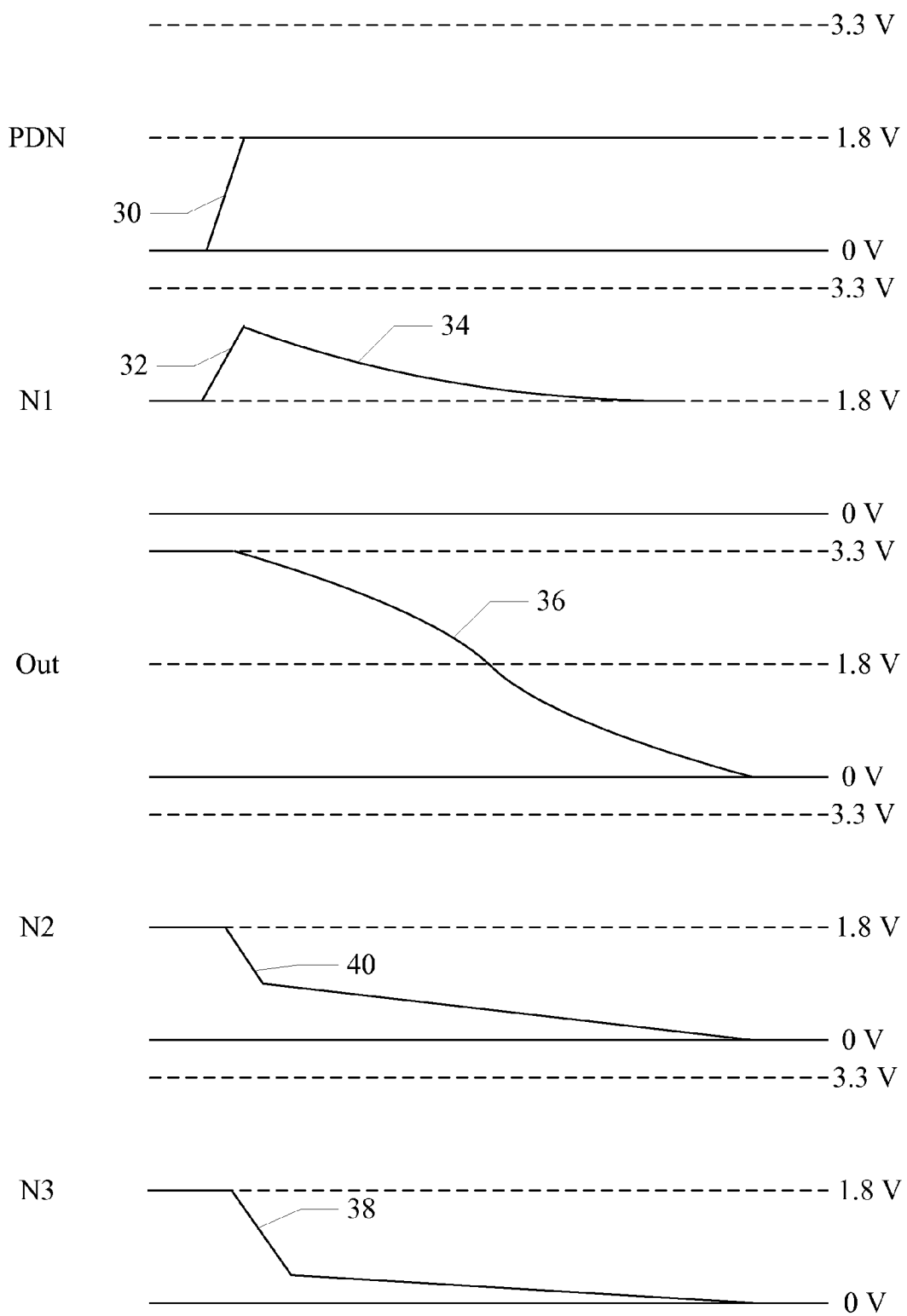
FIG. 3 is a timing diagram illustrating exemplary operation of one embodiment of the driver circuit shown in FIG. 2.

Turning now to FIG. 3, a timing diagram is shown illustrating the voltages at various points on the driver circuit 14 as shown in FIG. 2 for a pull down operation on the output, with the output beginning at a high voltage. The PDN signal is illustrated, along with output pad 22 and the nodes N1, N2, and N3 marked on the circuit shown in FIG. 2. Exemplary voltages of 3.3 and 1.8 voltages are used for this example, any voltages may be used in other examples.

The PDN signal is asserted, rising from zero volts ($V_{SS}$) to 1.8 volts ($V_{casc2}$) (reference numeral 30). In response to the rising edge, the voltage on N1 (the gate terminal of the transistor T2) rises from $V_{casc2}$ (1.8 volts) to somewhat less then 3.3 volts (reference numeral 32) through the capacitor C1. For example, in one implementation, the voltage rises to about 3 volts. The voltage then beings to decay through the resistor R2 (reference numeral 34). Additionally, the output begins at 3.3 volts and discharges to zero volts through T1, R1, and T2 (reference numeral 36). The voltage on N3 (the source of the transistor T1 discharges fairly rapidly (reference numeral 38). The voltage on N2 also drops (reference numeral 40), but the current through R1 keeps the voltage on N2 at a higher level until the discharge current drops to zero.

Numerous variations and modifications will become apparent to those skilled in the art once the above disclosure is fully appreciated. It is intended that the following claims be interpreted to embrace all such variations and modifications.

What is claimed is:
1. A driver circuit comprising:
a first transistor and a second transistor coupled in series between a power supply conductor and an output conductor of the driver circuit;
a third transistor and a fourth transistor coupled in series between a ground conductor and the output conductor;
a first capacitor coupled between a first gate terminal of the first transistor and a second gate terminal of the second transistor;
a second capacitor coupled between a third gate terminal of the third transistor and a fourth gate terminal of the fourth transistor;
a first conductor coupled to the first gate terminal, wherein a control signal on the first conductor is asserted during use to activate the first transistor;
a first resistor coupled to the second gate terminal, wherein an other end of the first resistor is coupled to a first reference voltage during use;
a second conductor coupled to the third gate terminal, wherein a control signal on the second conductor is asserted during use to activate the third transistor;
a second resistor coupled to the fourth gate terminal, wherein an other end of the second resistor is coupled to a second reference voltage during use.

2. The driver circuit as recited in claim 1 wherein the series connection of the first transistor and the second transistor further comprises a third resistor between the first transistor and the second transistor.

3. The driver circuit as recited in claim 2 wherein a resistance of the third resistor is less than or equal to about 20 percent of a series resistance in the first transistor when the first transistor is saturated.

4. The driver circuit as recited in claim 3 wherein the resistance of the third resistor is less than or equal to about 10 percent of the series resistance in the first transistor when the first transistor is saturated.

5. The driver circuit as recited in claim 2 wherein the series connection of the third transistor and the fourth transistor further comprises a fourth resistor between the third transistor and the fourth transistor.

6. The driver circuit as recited in claim 1 wherein the power supply conductor is powered during use to a voltage corresponding to a device coupled to the output conductor.

7. The driver circuit as recited in claim 1 further comprising a first clamp circuit coupled in parallel with the first capacitor, wherein the first clamp circuit is configured to limit a voltage across the first capacitor to a maximum.

8. The driver circuit as recited in claim 7 further comprising a second clamp circuit coupled in parallel with the second capacitor, wherein the second clamp circuit is configured to limit a voltage across the second capacitor to a maximum.

9. An integrated circuit comprising:
core circuitry that is powered by a first supply voltage during use, wherein the core circuitry comprises a control circuit configured to generate a pull up control signal, a pull down control signal that is separate from the pull up control signal, and at least one reference voltage; and
at least one driver circuit powered by a second supply voltage during use, the second supply voltage having a greater magnitude than the first supply voltage, wherein the driver circuit is connected to a pad of the integrated circuit that is connected to a pin on a package of the integrated circuit, and wherein the driver circuit comprises a cascode connection of a first transistor and a second transistor, and the driver circuit further comprises a capacitor coupled between a first gate terminal of the first transistor and a second gate terminal of the second transistor, wherein the first gate terminal is coupled to receive the pull down control signal, and wherein the at least one driver circuit further comprises a clamp circuit coupled in parallel with the capacitor, wherein the clamp circuit is configured to limit a voltage across the capacitor to a maximum.

10. The integrated circuit as recited in claim 9 wherein the driver circuit further comprises a second cascode connection of a third transistor and a fourth transistor, and the driver circuit further comprises a second capacitor coupled between a third gate terminal of the third transistor and a fourth gate terminal of the fourth transistor, and wherein the third gate terminal is coupled to receive the pull up control signal.

11. The integrated circuit as recited in claim 10 wherein the driver circuit further comprises a second clamp circuit coupled in parallel with the second capacitor, wherein the second clamp circuit is configured to limit a voltage across the second capacitor to a maximum.

12. The integrated circuit as recited in claim 10 wherein a first voltage on the second gate terminal during use is derived, in part, from a first reference voltage of the at least one reference voltage and wherein a second voltage on the fourth gate terminal is derived, in part, from a second reference voltage of the at least one reference voltage.

13. The integrated circuit as recited in claim 12 wherein the first voltage is further derived from the capacitor, and wherein the second voltage is further derived from the second capacitor.

14. The integrated circuit as recited in claim 12 wherein the first reference voltage and the second reference voltage are the same voltage.

15. The integrated circuit as recited in claim 9 wherein the cascode connection of the first transistor and the second transistor further comprises a resistor between the first transistor and the second transistor.

16. The integrated circuit as recited in claim 15 wherein a resistance of the resistor is less than or equal to about 20 percent of a series resistance in the first transistor when the first transistor is saturated.

17. An integrated circuit comprising:
core circuitry that is powered by a first supply voltage during use, wherein the core circuitry comprises a control circuit configured to generate a pull up control signal, a pull down control signal, and at least one reference voltage having a magnitude that is greater than zero with respect to a ground voltage during use; and
at least one driver circuit powered by a second supply voltage during use, wherein the second supply voltage is supplied on a conductor to which at least one transistor in the at least one driver circuit has a source connection, the second supply voltage having a greater magnitude than the first supply voltage during use, wherein the driver circuit is connected to a pad of the integrated circuit that is connected to a pin on a package of the integrated circuit, and wherein the driver circuit comprises a cascode connection of a first transistor and a second transistor, and the driver circuit further comprises a capacitor coupled between a first gate terminal of the first transistor and a second gate terminal of the second transistor, wherein the first gate terminal is coupled to receive the pull down control signal, and wherein the second gate terminal is responsive to the at least one reference voltage.

18. The integrated circuit as recited in claim 17 wherein the driver circuit further comprises a second cascode connection of a third transistor and a fourth transistor, and wherein the third transistor has the source connection to the conductor on which the second power supply is supplied during use, and the driver circuit further comprises a second capacitor coupled between a third gate terminal of the third transistor and a fourth gate terminal of the fourth transistor, and wherein the third gate terminal is coupled to receive the pull up control signal.

19. The integrated circuit as recited in claim 18 wherein the driver circuit further comprises a first clamp circuit coupled in parallel with the capacitor and configured to limit a voltage across the capacitor to a maximum, and wherein the driver circuit further comprises a second clamp circuit coupled in parallel with the second capacitor, wherein the second clamp circuit is configured to limit a voltage across the second capacitor to a maximum.

20. The integrated circuit as recited in claim 18 wherein the cascode connection of the first transistor and the second transistor further comprises a first resistor between the first transistor and the second transistor, and wherein the cascode connection of the third transistor and the fourth transistor further comprises a second resistor between the third transistor and the fourth transistor.

21. The integrated circuit as recited in claim 20 wherein a resistance of each of the first resistor and the second resistor is less than or equal to about 20 percent of a series resistance in the first transistor when the first transistor is saturated.

22. The integrated circuit as recited in claim 17 further comprising a resistor coupled to the second gate terminal, wherein an other end of the resistor is coupled to the at least one reference voltage.

23. An integrated circuit comprising:
core circuitry that is powered by a first supply voltage during use, wherein the core circuitry comprises a control circuit configured to generate a pull up control signal, a pull down control signal, and at least one reference voltage having a magnitude that is approximately midrange between a second power supply voltage and a ground voltage during use, wherein the second power supply voltage has a greater magnitude during use than the first power supply voltage; and
at least one driver circuit powered by the second supply voltage during use, wherein the second supply voltage is supplied on a conductor to which at least one transistor in the at least one driver circuit has a source connection, the second supply voltage having a greater magnitude than the first supply voltage during use, wherein the driver circuit is connected to a pad of the integrated circuit that is connected to a pin on a package of the integrated circuit, and wherein the driver circuit comprises a cascode connection of a first transistor and a second transistor, and the driver circuit further comprises a capacitor coupled between a first gate terminal of the first transistor and a second gate terminal of the second transistor, wherein the first gate terminal is coupled to receive the pull down control signal, and wherein the second gate terminal is responsive to the at least one reference voltage.

24. The integrated circuit as recited in claim 23 wherein the driver circuit further comprises a second cascode connection of a third transistor and a fourth transistor, and wherein the third transistor has the source connection to the conductor on which the second power supply is supplied during use, and the driver circuit further comprises a second capacitor coupled between a third gate terminal of the third transistor and a fourth gate terminal of the fourth transistor, and wherein the third gate terminal is coupled to receive the pull up control signal.

25. The integrated circuit as recited in claim 24 wherein the driver circuit further comprises a first clamp circuit coupled in parallel with the capacitor and configured to limit a voltage across the capacitor to a maximum, and wherein the driver circuit further comprises a second clamp circuit coupled in parallel with the second capacitor, wherein the second clamp circuit is configured to limit a voltage across the second capacitor to a maximum.

26. The integrated circuit as recited in claim 24 wherein the cascode connection of the first transistor and the second transistor further comprises a first resistor between the first transistor and the second transistor, and wherein the cascode connection of the third transistor and the fourth transistor further comprises a second resistor between the third transistor and the fourth transistor.

27. The integrated circuit as recited in claim 26 wherein a resistance of each of the first resistor and the second resistor is less than or equal to about 20 percent of a series resistance in the first transistor when the first transistor is saturated.

28. The integrated circuit as recited in claim 23 further comprising a resistor coupled to the second gate terminal, wherein an other end of the resistor is coupled to the at least one reference voltage.

29. A driver circuit comprising:
   a first cascode connection of a first transistor and a second transistor between a power supply conductor and an output pad;
   a first capacitor coupled between a first gate terminal of the first transistor and a second gate terminal of the second transistor;
   a first resistor coupled to the second gate terminal, wherein an other end of the first resistor is coupled to a first reference voltage between a power supply voltage on the power supply conductor during use and a ground voltage on a ground conductor during use;
   a second cascode connection of a third transistor and a fourth transistor between the ground conductor and the output pad;
   a second capacitor coupled between a third gate terminal of the third transistor and a fourth gate terminal of the fourth transistor; and
   a second resistor coupled to the third gate terminal.

30. The driver circuit as recited in claim 29 wherein the first cascode connection further comprises a third resistor between the first transistor and the second transistor, and wherein the second cascode connection further comprises a fourth resistor between the third transistor and the fourth transistor.

31. The driver circuit as recited in claim 29 wherein an other end of the second resistor is coupled to a second reference voltage between a power supply voltage on the power supply conductor during use and a ground voltage on the ground conductor during use.

32. The driver circuit as recited in claim 29 wherein an other end of the second resistor is coupled to the first reference voltage.

* * * * *